US009921468B2

(12) United States Patent
Holzapfel et al.

(10) Patent No.: US 9,921,468 B2
(45) Date of Patent: Mar. 20, 2018

(54) X-Y TABLE WITH A POSITION-MEASURING DEVICE

(71) Applicant: DR. JOHANNES HEIDENHAIN GmbH, Traunreut (DE)

(72) Inventors: Wolfgang Holzapfel, Obing (DE); Joerg Drescher, Samerbeg (DE); Markus Meissner, Uebersee (DE); Ralph Joerger, Traunstein (DE); Bernhard Musch, Traunstein (DE); Thomas Kaelberer, Schrobenhausen (DE)

(73) Assignee: DR. JOHANNES HEIDENHAIN GmbH, Traunreut (DE)

( * ) Notice: Subject to any disclaimer, the term of this patent is extended or adjusted under 35 U.S.C. 154(b) by 0 days.

(21) Appl. No.: 15/291,088

(22) Filed: Oct. 12, 2016

(65) Prior Publication Data
US 2017/0102227 A1 Apr. 13, 2017

(30) Foreign Application Priority Data

Oct. 13, 2015 (DE) ........................ 10 2015 219 810

(51) Int. Cl.
G03F 7/00 (2006.01)
G01D 5/26 (2006.01)
G01D 5/30 (2006.01)

(52) U.S. Cl.
CPC ............... *G03F 7/00* (2013.01); *G01D 5/266* (2013.01); *G01D 5/30* (2013.01)

(58) Field of Classification Search
CPC ....................................................... G03F 7/00

USPC ......................................................... 356/614
See application file for complete search history.

(56) References Cited

U.S. PATENT DOCUMENTS

| 5,436,718 A * | 7/1995 | Fernandes ............ G01N 21/253 250/458.1 |
| 7,902,494 B2 | 3/2011 | Klaver et al. |
| 8,822,907 B2 | 9/2014 | Joerger et al. |
| 2010/0208274 A1* | 8/2010 | Kindlein .................. A61B 6/08 356/603 |

(Continued)

FOREIGN PATENT DOCUMENTS

EP 2450673 A2 5/2012
WO WO 2007034379 A2 3/2007

*Primary Examiner* — Tarifur Chowdhury
*Assistant Examiner* — Omar Nixon
(74) *Attorney, Agent, or Firm* — Leydig, Voit & Mayer, Ltd.

(57) ABSTRACT

An X-Y table with a position-measuring device includes a table which is disposed on a support and is movable on the support so that altogether the table is positionable in a plane parallel to an underlying stationary base. Two groups of scanning heads are disposed on the support. For position measurement in two directions, a respective one of the scanning heads directs light through a respective transmissive scale attached along an edge of the table such that a respective reflective scale, which is stationary relative to a processing tool disposed above the table, reflects the light through the respective transmissive scale back to the respective scanning head. In a central position of the table, the two groups are in positional correspondence with the transmissive scales, and, in either of two edge positions of the table, only one of the two groups is in positional correspondence with the transmissive scales.

11 Claims, 5 Drawing Sheets

(56) References Cited

U.S. PATENT DOCUMENTS

| | | | |
|---|---|---|---|
| 2013/0335750 A1* | 12/2013 | Bihr | G01B 11/14 356/614 |
| 2015/0070711 A1* | 3/2015 | Holzapfel | G01D 5/38 356/614 |
| 2015/0226539 A1* | 8/2015 | Roeth | G01B 11/005 356/614 |

\* cited by examiner

X-Y TABLE WITH A POSITION-MEASURING DEVICE

CROSS-REFERENCE TO PRIOR APPLICATION

Priority is claimed to German Patent Application No. DE 10 2015 219 810.3, filed on Oct. 13, 2015, the entire disclosure of which is hereby incorporated by reference herein.

FIELD

The present invention relates to an X-Y table with a position-measuring device for measuring the position of a table relative to a tool in at least two directions. Such X-Y tables are used, for example, in the processing or inspection of wafers when a wafer placed on the table must be positioned under a tool. The tool may, for example, be the lens of an exposure device or a microscope of an inspection system.

BACKGROUND

In many areas of technology, an object placed on a table that is movable in at least two directions must be very accurately positioned together with the table relative to a tool. In this connection, interferometers are frequently used as position-measuring devices. However, due to variations in the refractive index of the air traversed by the laser light, such interferometers are unable to measure with sufficient accuracy and, therefore, position-measuring devices based on the scanning of scales are being increasingly used for such applications. Such measuring devices are less prone to failures resulting from environmental conditions because the distance traveled by the light for scanning the scales is only a few millimeters, which is significantly less than when using interferometers, where light paths of several decimeters must be reckoned with.

International Patent Publication WO 2007/034379 A2 describes an optical position-measuring device where a table is positionable relative to an underlying stationary base in two orthogonal directions parallel to the underlying base. For this purpose, transmissive scales are attached laterally to the edges of the table. Light from scanning heads passes through the transmissive scales and impinges on reflective scales located above the table in stationary relationship with respect to a tool. From there, the light is reflected and passed through the transmissive scales back to the scanning heads. Each scanning head scans a transmissive scale and a reflective scale arranged at a right angle thereto. Owing to the crossed arrangement of the two scales, a scanning head is cable of measuring the position of the table in one direction independently of the position of the table in the respective other direction. With three such measuring devices, it is possible to measure the two linear directions (X and Y) extending in the plane of the table and the rotation (rZ) about an axis perpendicular to the plane of the table. This publication further explains that the crossed scales may have periodic structures in both linear measurement directions, so that measurement in both measurement directions is possible using suitable sensors at a point of intersection of two scales.

European Patent Application EP 2450673 A2, which also deals with such measuring devices, further describes ways of measuring also the linear direction (Z) normal to the plane of the table using a measuring device for a direction of movement (X or Y) of the table. With three such measuring devices, it is possible to measure all degrees of freedom of the table; i.e., the translation directions X, Y and Z as well as the rotations about the translation axes; i.e., rX, rY and rZ.

SUMMARY

In an embodiment, the present invention provides an X-Y table with a position-measuring device. A table is disposed on a support that is movable relative to a underlying stationary base in one of two orthogonal directions of a plane of the table. The table is movable on the support in the other of the two directions so that altogether the table is positionable in a plane parallel to the underlying stationary base. Two groups of scanning heads are disposed on the support. For position measurement in each of the two directions, a respective one of the scanning heads is configured to direct light through a respective transmissive scale attached along an edge of the table such that a respective reflective scale, which is stationary relative to a processing tool disposed above the table, reflects the light through the respective transmissive scale back to the respective scanning head. In a central position of the table, the two groups of scanning heads are in positional correspondence with the transmissive scales, and, in either of two edge positions of the table, only one of the two groups of scanning heads is in positional correspondence with the transmissive scales.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1A:
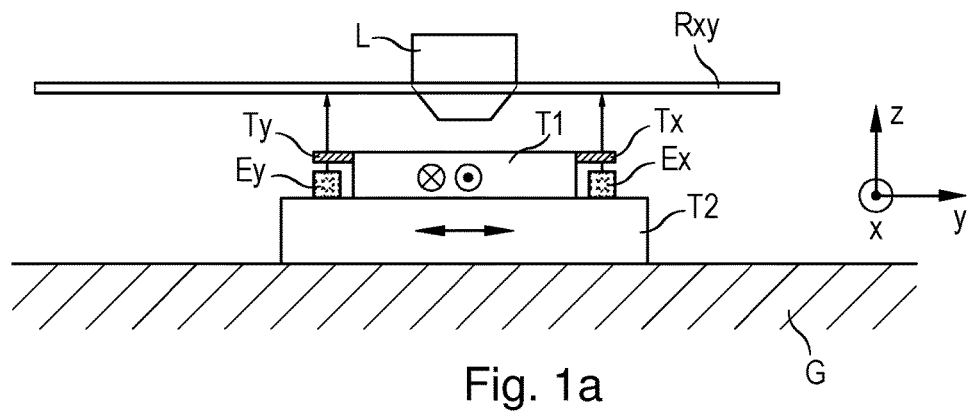
FIGS. 1a-1c show views from the X, Y and Z directions, respectively, of an X-Y table with a position-measuring device according to a first exemplary embodiment.

The inventors have recognized that the measuring devices of the prior art have the disadvantage that the maximum travel of the table in a direction is limited to the length of the transmissive scale that is attached to a table edge extending in this direction. Since, for mechanical reasons, such a scale cannot be much longer than the table edge, the travel range is limited to a value approximately equal to the length of the table edge. However, in various applications, the inventors have recognized it is desirable to move the table and the object placed thereon over a significantly longer distance.

Accordingly, an embodiment of the present invention improves the prior art position-measuring devices used on X-Y tables in a manner that overcomes the limitation on the maximum travel range.

According to an embodiment, an X-Y table with a position-measuring device is provided, including a table which is disposed on a support that is movable relative to an underlying stationary base in one of two orthogonal directions of the plane of the table, and which table is movable on this support in the other of the two directions, so that altogether the table is positionable in a plane parallel to the underlying stationary base. For position measurement in each of the two directions, a respective scanning head directs light through a transmissive scale attached along an edge of the table. A reflective scale, which is stationary relative to a processing tool disposed above the table, reflects the light through the transmissive scale back to the scanning head. Two groups of scanning heads are disposed on the support, so that when the table is in a central position, both groups are in positional correspondence with the transmissive scales, and when the table is in either of two edge positions, only one of these groups is in positional correspondence with the transmissive scales.

Thus, when the table is in a central position, position values can be obtained from both groups of scanning heads. However, once the table has moved so far that a scanning head of one of the two groups is no longer located in the region of the transmissive scale, a complete set of position values can still be obtained by means of the other group. The possible travel range, which, in the case of a single group, would be limited to the length of the transmissive scale and thus to the length of the table edge, is increased by the distance between the two groups.

Since, in a central position, the two groups of scanning heads must sense positions simultaneously, their distance is limited to a value slightly less than the length of the transmissive scale. Nevertheless, the possible travel range can be nearly doubled in this manner.

If each group of scanning heads includes at least three scanning heads which, in addition to their respective measurement direction in the plane of the table, can also measure in a direction normal to the plane of the table, then it is possible to determine the position of the table relative to the tool in all six degrees of freedom, and to do so over a travel range of the table that is increased to extend significantly beyond the extent of the table.

The specific application of this increase in travel range on an X-Y table having two orthogonal linear axes, stacked upon one another, allows for different embodiments of the present invention. For line-by-line processing of an object (which requires a most accurate continuous movement along a line over the entire width of the object, as well as a slightly less accurate shorter movement for line feed in a direction perpendicular thereto), different arrangements are obtained for the two axes, and thus also for the scanning heads and scales. Two particularly advantageous embodiments will be described below with reference to the figures.

Figure 1B:
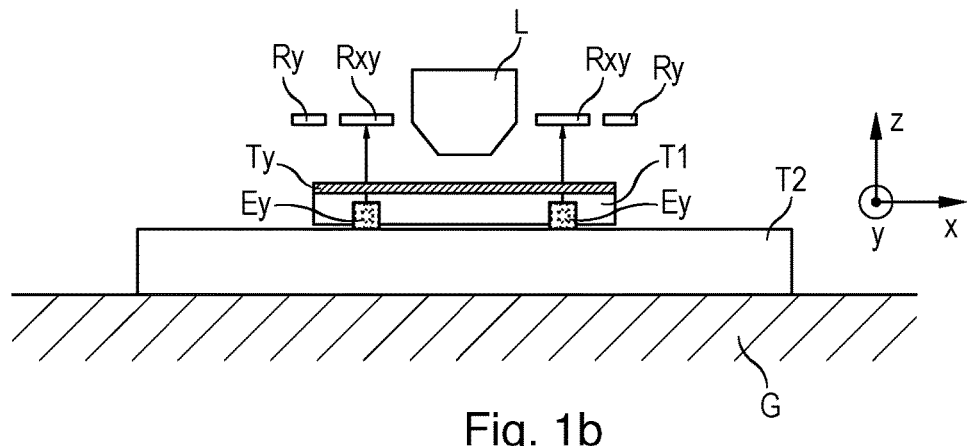
Figure 1C:
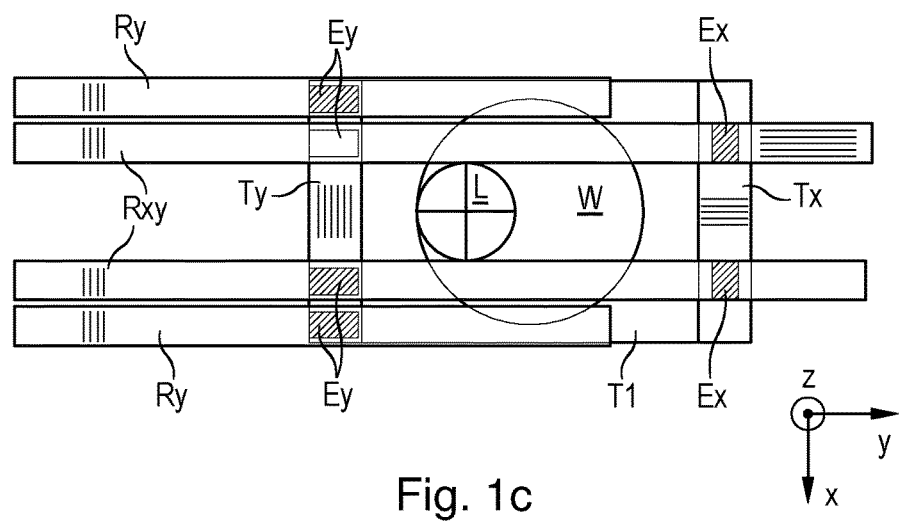

FIGS. 1a through 1c show a first exemplary embodiment of an X-Y table with an inventive position-measuring device from different viewing directions X, Y, Z.

Table T1 is disposed on a support T2 and equipped with suitable linear guides and linear drives, so that it is positionable relative to support T2 in the X direction. The guides and drives used for this purpose, as well as the electronics for controlling the same, are commercially available and can be selected according to the required accuracy and dynamics. They are not described in further detail herein.

Support T2 is positionable relative to underlying base G in the Y direction by suitable guides and drives, the Y direction being orthogonal to the X direction. Overall, therefore, table T1 is movably supported in an X-Y plane and can reach any point in this X-Y plane within a certain area.

An object W to be processed by a tool L can be placed on table T1. This object may be a wafer W to be positioned under a lens L. This lens L may be used, for example, to expose a light-sensitive photoresist, or wafer W may be inspected with a microscope. In the field of semiconductor fabrication, in particular, one deals with very fine structures in the micrometer or even nanometer size range, which requires very accurate positioning and position measurement.

To measure the position of table T1 (and thus of the wafer W placed thereon) relative to tool L, reflective scales Ry, Rxy extending in the Y direction are disposed laterally adjacent to tool L in stationary relationship thereto. Scanning heads Ex, Ey are disposed on support T2 laterally with respect to table T1. These scanning heads Ex, Ey direct light toward reflective scales Ry, Rxy.

Along its path, the light passes through one of the transmissive scales Tx, Ty attached laterally to the edges of table T1 and extending in the X direction, initially without any interaction. The light then interacts with periodic structures on one of the reflective scales Ry, Rxy and is directed back to transmissive scale Tx, Ty, where it interacts twice with periodic structures and is redirected by a mirror to reflective scale Ry, Rxy. There, the light undergoes interference and is directed back toward scanning head Ex, Ey, finally passing once again through transmissive scale Tx, Ty without any interaction. Overall, therefore, the light interacts twice with the periodic structures of a reflective scale Ry, Rxy and twice with the periodic structures of a transmissive scale Tx, Ty. The relative position between table T1 and tool L can be derived in a known manner from the light modulation resulting from interference; i.e., by analyzing the light modulation in scanning heads Ex, Ey, and may be used for controlling the axes.

In the figures, scanning heads Ex, Ey are drawn as rectangles, the longer edges of which indicate the direction X, Y in which the respective scanning head Ex, Ey can measure a position. For this purpose, the light from each scanning head Ex, Ey must strike suitable structures both on transmissive scale Tx, Ty as well as on reflective scale Ry, Rxy. Such structures may be, for example, grating lines oriented perpendicular to the respective measurement direction X, Y.

The two outer scales Ry of the four reflective scales are provided with structures that enable position determination in the Y direction, such as, for example, periodic lines perpendicular to the Y direction. The two inner reflective scales Rxy carry structures that enable both position determination in the Y direction and position determination in the X direction since, as can be seen in FIG. 1c, these inner reflective scales Rxy are scanned both by scanning heads Ey for the Y direction and by scanning heads Ex for the X direction. For this purpose, suitably oriented gratings may be arranged adjacent one another, or a cross grating may be used.

As can be seen particularly well in FIG. 1c, scanning heads Ex, Ey are disposed on support T2 underneath reflective scales Ry, Rxy. Since support T2 moves relative to underlying base G only in the Y direction, and reflective scales Ry, Rxy extend in the Y direction, it is ensured that the light from the scanning heads strikes a reflective scale Ry, Rxy in any position of support T2. Thus, table T1, which is moved along with support T2, can perform a complete scanning movement in the Y direction during which at least a portion of the scanning heads Ex, Ey always remains in positional correspondence with scales Tx, Ty, Ry, Rxy.

Figure 2A:
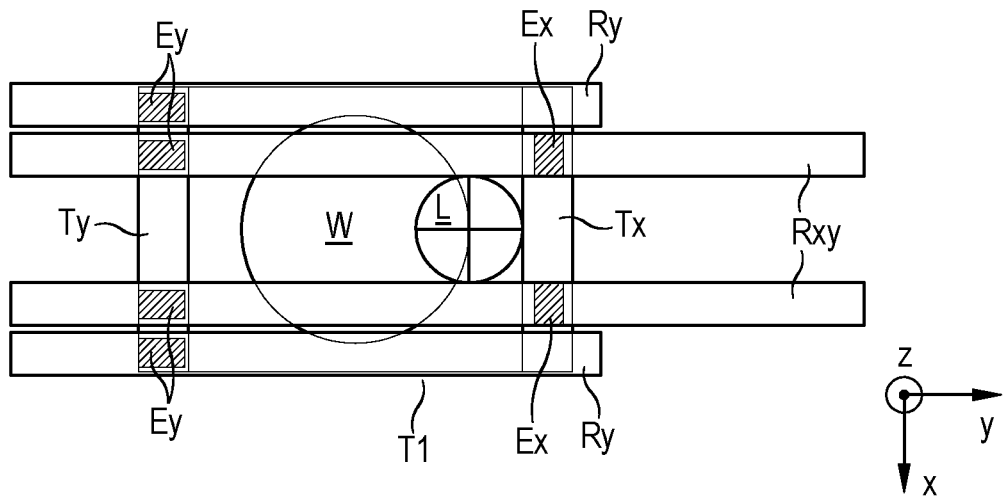
FIGS. 2a-2c illustrate a scanning movement of the table of FIGS. 1a-1c, in a first, second and third position, respectively.
Figure 2B:
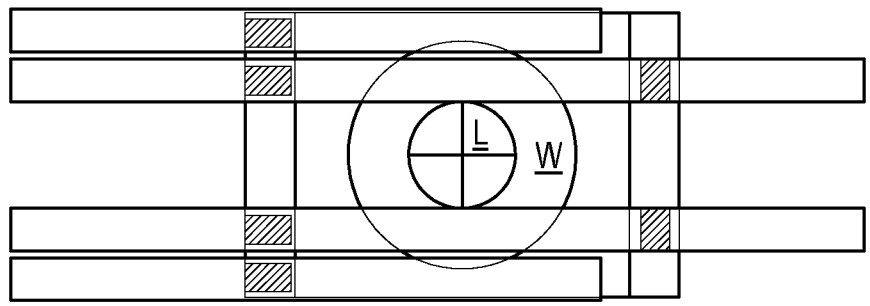
Figure 2C:
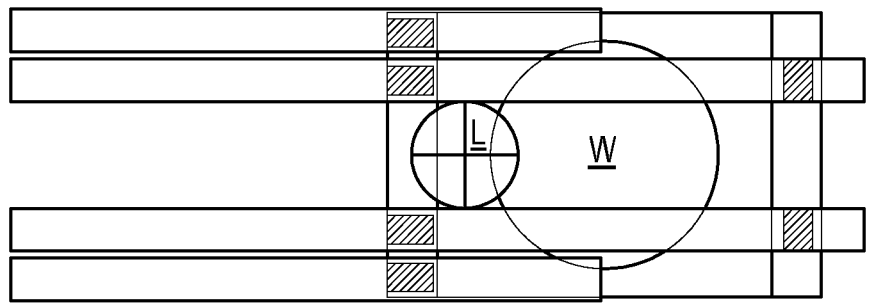

In FIGS. 2a through 2c, a scanning movement of table T1 in the Y direction is shown for a central position of table T1 with respect to the X direction. As can be seen, all six scanning heads Ex, Ey are always in positional correspondence with respective transmissive and reflective scales Tx, Ty, Ry, Rxy. The length of this scanning movement is only limited by the length of reflective scales Ry, Rxy. Since these scales are stationary, greater lengths, and thus large travel ranges, are not a problem.

Figure 3A:
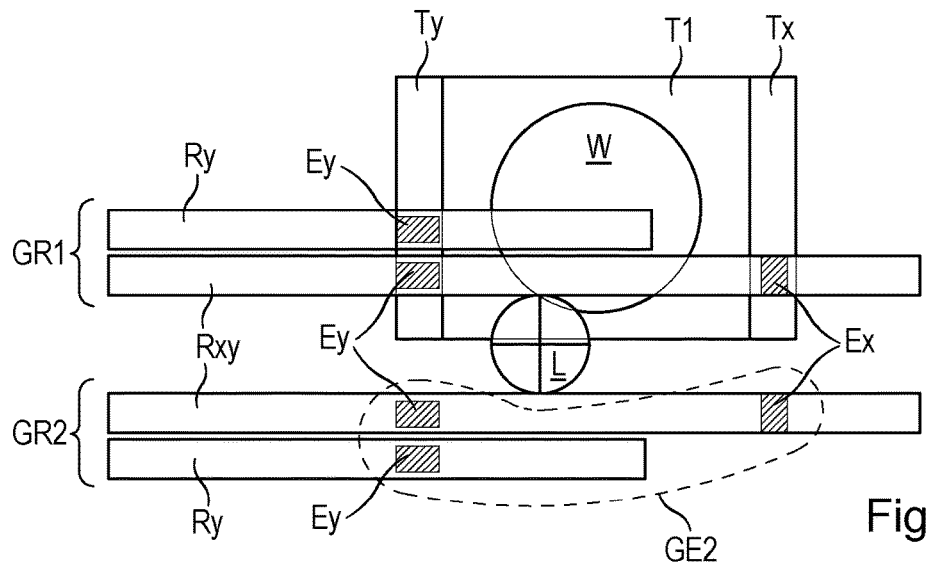
FIGS. 3a-3c illustrate a line-feed movement of the table of FIGS. 1a-1c, in a first, second and third position, respectively.
Figure 3B:
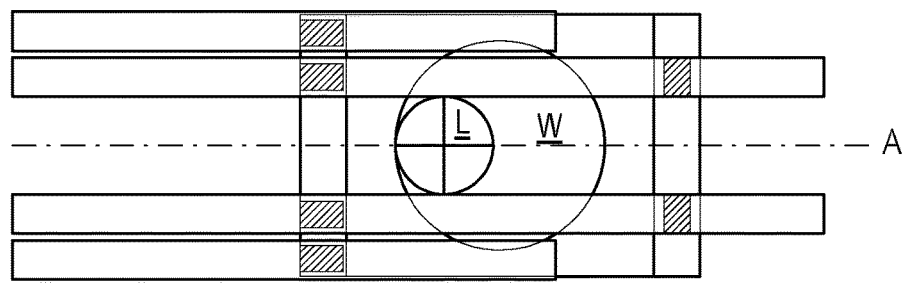
Figure 3C:
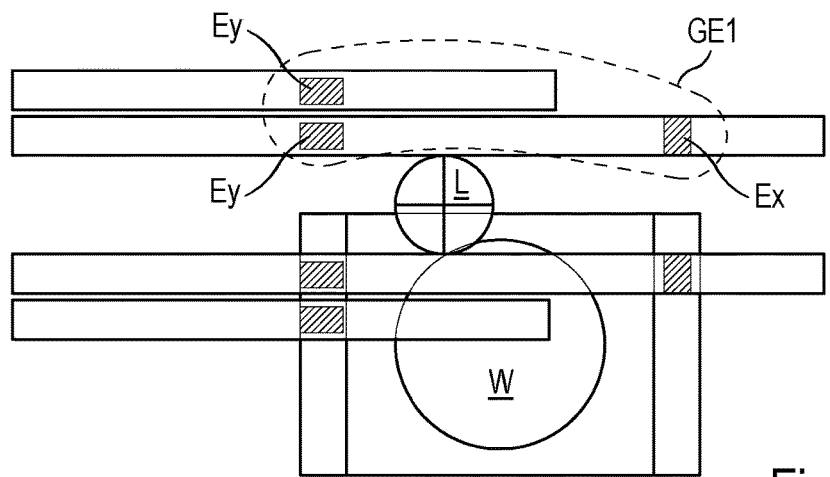

What is more interesting is the movement in the X direction shown in FIGS. 3a through 3c, which table T1 must perform for a line-feed operation. It is only in a central position, shown in FIG. 3b, that all six scanning heads are in positional correspondence (this position corresponds to the position of table T1 shown in FIG. 2b), whereas in either of the edge positions shown in FIGS. 3a and 3c, only three scanning heads Ex, Ey are in positional correspondence with respective scales Tx, Ty, Ry, Rxy. Nevertheless, it is ensured that at least two Y positions and one X position can be determined, which also makes it possible to calculate the rotation of table T1 about the Z direction.

When the three scanning heads Ex, Ey which, in the edge position shown in FIG. 3a, are in positional correspondence with transmissive scales Tx, Ty are combined into a first group GE1 of scanning heads Ex, Ey (indicated in FIG. 3c for reasons of space limitations), and the three scanning heads Ex, Ey which, in the edge position shown in FIG. 3c, are in positional correspondence with transmissive scales Tx, Ty are combined into a second group GE2 of scanning heads Ex, Ey (indicated in FIG. 3a), then one may say, in short, that two groups GE1, GE2 of scanning heads Ex, Ey are disposed on support T2 such that when table T1 is in a central position, both groups GE1, GE2 are in positional correspondence with transmissive scales Tx, Ty, and when table T1 is in either of two edge positions, only one of these groups GE1, GE2 is in positional correspondence with transmissive scales Tx, Ty.

In the central position of table T1 with respect to the X direction, shown in FIG. 3b, all scanning heads Ex, Ey are ready for operation, so that it is possible to switch from one portion of the scanning heads Ex, Ey to the remaining ones in time before a portion of the scanning heads Ex, Ey fails. During the travel from one edge position to the other, it is thus possible to switch from one group GE1 of scanning heads Ex, Ey to the other group GE2.

Similarly, reflective scales Ry, Rxy could be divided into two groups GR1, GR2, based on their association with the two groups GE1, GE2 of scanning heads Ex, Ey.

FIG. 3b indicates that the two groups GE1, GE2 of scanning heads Ex, Ey, and thus also the two groups GR1, GR2 of reflective scales Rx, Ry, are arranged symmetrically with respect to an axis A extending parallel to scanning direction Y and through the center of tool L. To be more precise, scanning heads Ex, Ey of second group GE2 are obtained by mirroring scanning heads Ex, Ey of first group GE1 about axis A. The same is true for reflective scales Ry, Rxy of the two groups GR1, GR2. These symmetries are advantageous because, given an optimal design of the X-Y table, the center of the table is not displaced in response to thermal expansion of the mechanical parts. The displacements detected by scanning heads Ex, Ey in the case of thermal expansion can be particularly easily compensated for due to the symmetrical arrangement of the two groups GE1, GE2 of scanning heads Ex, Ey and groups GR1, GR2 of reflective scales Rx, Ry. Also, given a good machine design, thermal expansions occur symmetrically with respect to tool L and, therefore, it is advantageous to arrange reflective scales Rx, Ry symmetrically with respect to tool L.

Although transmissive scales Tx, Ty, which are moved along with table T1, are limited in length because any portions extending beyond the table edge would tend to vibrate, the travel range is nevertheless greater than the length of the table edges because it is increased by the distance between the two groups GE1, GE2 of scanning heads Ex, Ey.

The arrangement described in this exemplary embodiment has the advantage that it is not necessary to switch between groups GE1, GE2 during a fast scanning movement of table T2 (in the Y direction). Moreover, only one such switchover is necessary during the processing of a wafer, it being possible to perform the switchover during a noncritical line-feed movement (in the X direction). Thus, the effort required to perform such a switchover can be kept small.

However, this first exemplary embodiment has the disadvantage that table T1, which is only needed for the line-feed operation, must always be carried along with support T2 during the fast scanning movement in the Y direction. This means that a considerable mass must be moved, which affects the dynamics of the scanning movement and increases the effort required to achieve the desired dynamics. In addition, scanning heads Ex, Ey disposed on support T2 are also carried along during the scanning movement, so that the cables needed for the connection of the scanning heads must be moved along therewith.

Therefore, with reference to FIGS. 4 and 5, a modified X-Y table with a position-measuring device is described as a second exemplary embodiment, in which the axes for the scanning movement and the line-feed movement are arranged in reverse order to obtain dynamic advantages. However, this comes at the expense of having to switch between two groups of scanning heads for each scanning movement.

Figure 4A:
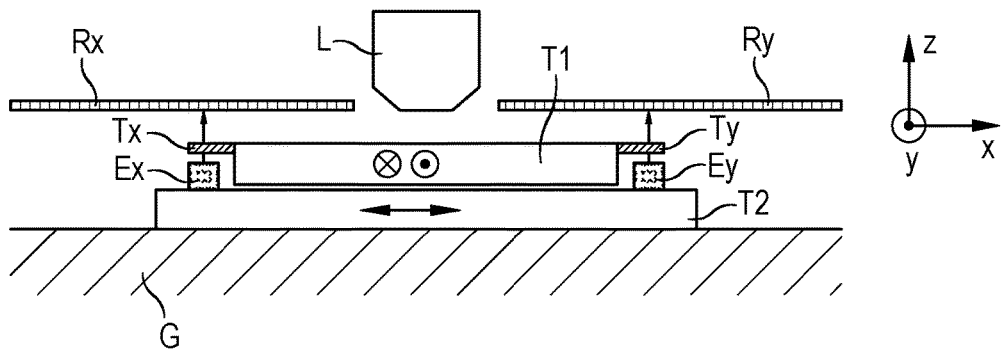
FIGS. 4a-4c show views from the Y, X and Z directions, respectively, of an X-Y table with a position-measuring device according to a second exemplary embodiment.
Figure 4B:
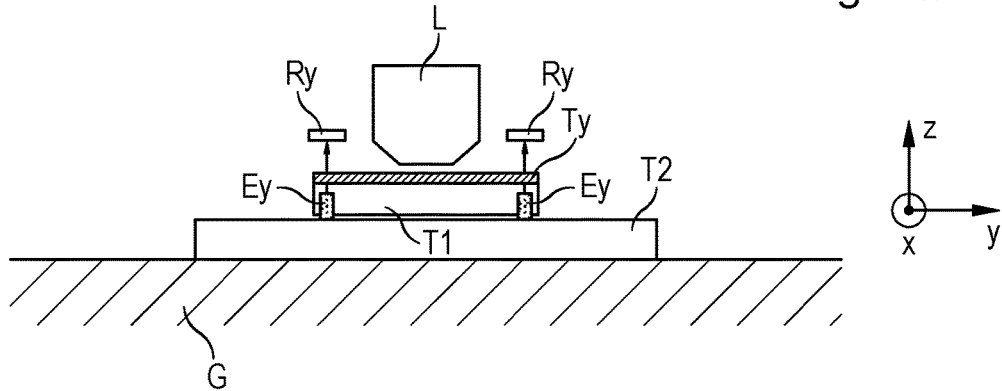
Figure 4C:
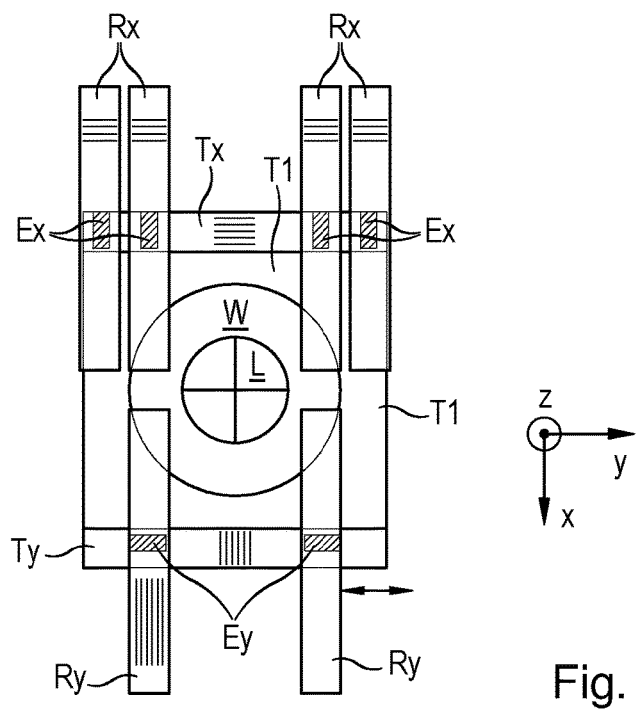

FIGS. 4a through 4c show a second exemplary embodiment of an X-Y table with an inventive position-measuring device from different viewing directions Y, X, Z. In these views, the direction of the scanning movement is again denoted by Y.

Table T1 is disposed on support T2 and equipped with suitable linear guides and linear drives, so that it is positionable relative to support T2 in the Y direction. Thus, only table T1 must be moved for a scanning movement, but not support T2.

In order to perform a line-feed operation, support T2 is positionable relative to underlying base G in the X direction by suitable guides and drives, the X direction being orthogonal to the Y direction.

An object W to be processed by a tool L can be placed on table T1. This object may, for example, be the wafer mentioned in the first exemplary embodiment.

To measure the position of table T1 (and thus of the wafer W placed thereon) relative to tool L, reflective scales Rx, Ry extending in the X direction are disposed laterally adjacent to tool L in stationary relationship thereto. Scanning heads Ex, Ey are disposed on support T2 laterally with respect to table T1. These scanning heads Ex, Ey direct light toward reflective scales Rx, Ry.

Along its path, the light passes through one of the transmissive scales Tx, Ty attached laterally to the edges of table T1 and extending in the X direction, initially without any interaction. The light then interacts with periodic structures on one of the reflective scales Rx, Ry and is directed back to transmissive scale Tx, Ty, where it interacts twice with periodic structures and is redirected by a mirror to reflective scale Rx, Ry. There, the light undergoes interference and is directed back toward scanning head Ex, Ey, finally passing once again through transmissive scale Tx, Ty without any interaction. Overall, therefore, the light interacts twice with the periodic structures of a reflective scale Rx, Ry and twice with the periodic structures of a transmissive scale Tx, Ty. The relative position between table T1 and tool L can be derived in a known manner from the light modulation resulting from interference; i.e., by analyzing the light modulation in scanning heads Ex, Ey, and may be used for controlling the axes.

All of the four scales Tx, Rx and the four associated scanning heads Ex shown in the upper half of FIG. 4c measure positions in the X direction, while the two scales Ty, Ry and the two associated scanning heads Ey shown in the lower half of FIG. 4c are used to measure positions in the Y direction.

As can be seen particularly well in FIG. 4c, scanning heads Ex, Ey are disposed on support T2 underneath reflective scales Rx, Ry. The line-feed movement in the X direction, here performed by support T2, is limited by the length of reflective scales Rx, Ry because scanning heads Ex, Ey must always be located underneath their respectively associated scales. However, as can be seen from FIG. 4c, wafer W can be completely processed in the X direction of the line feed.

FIG. 5 shows the scanning movement in the Y direction of table T1, specifically for a central position of support T2 with respect to the X direction.

Figure 5A:
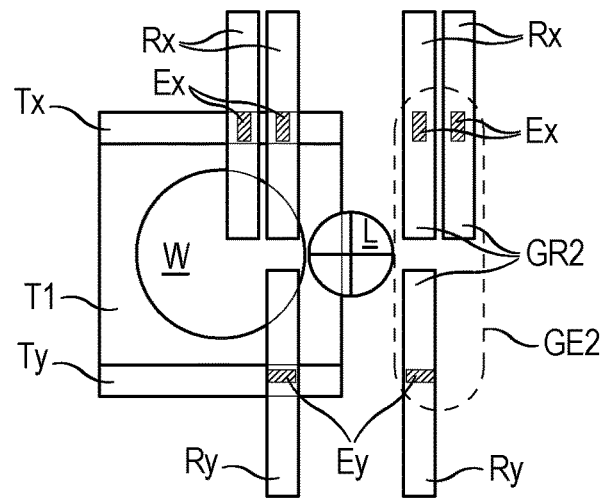
FIGS. 5a-5c illustrate a scanning movement of the table of FIGS. 4a-4c, in a first, second and third position, respectively.
Figure 5B:
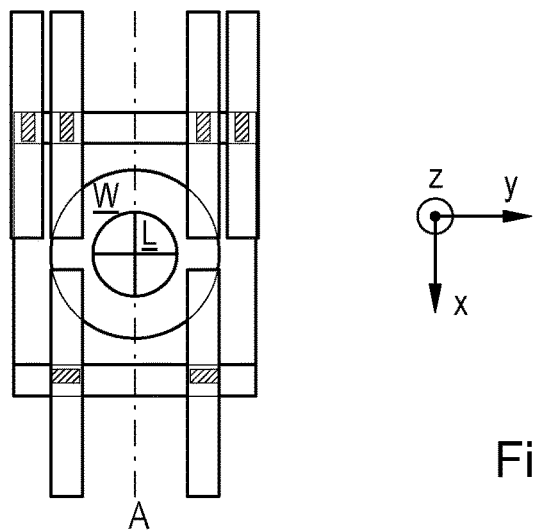
Figure 5C:
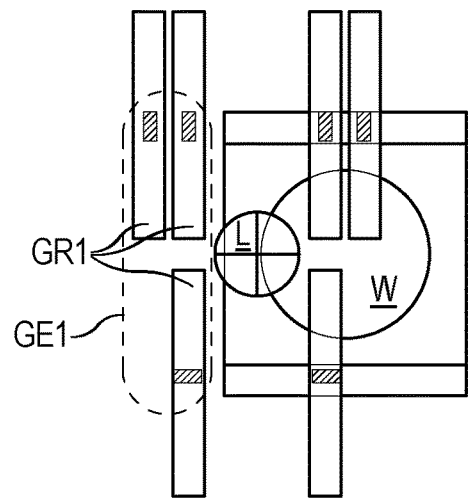

When the three scanning heads Ex, Ey which, in the edge position shown in FIG. 5a, are in positional correspondence with transmissive scales Tx, Ty are combined into a first group GE1 of scanning heads Ex, Ey (indicated in FIG. 5c for reasons of space limitations), and the three scanning heads Ex, Ey which, in the edge position shown in FIG. 5c, are in positional correspondence with transmissive scales Tx, Ty are combined into a second group GE2 of scanning heads Ex, Ey (indicated in FIG. 5a), again one may say, in short, that two groups GE1, GE2 of scanning heads Ex, Ey are disposed on support T2 such that when table T1 is in a central position, both groups GE1, GE2 are in positional correspondence with transmissive scales Tx, Ty, and when table T1 is in either of two edge positions, only one of these groups GE1, GE2 is in positional correspondence with transmissive scales Tx, Ty.

In the central position of table T1 with respect to the Y direction, shown in FIG. 5b, all scanning heads Ex, Ey are ready for operation, so that it is possible to switch from one portion of the scanning heads Ex, Ey to the remaining ones in time before a portion of the scanning heads Ex, Ey fails. During the travel from one edge position to the other, position determination can thus be handed over from one group GE1 of scanning heads Ex, Ey to the other group GE2 of scanning heads Ex, Ey.

Similarly, reflective scales Rx, Ry could be divided into two groups GR1, GR2, based on their association with the two groups GE1, GE2 of scanning heads Ex, Ey.

FIG. 5b indicates that the two groups GE1, GE2 of scanning heads Ex, Ey, and thus also the two groups GR1, GR2 of reflective scales Rx, Ry, are arranged symmetrically with respect to an axis A extending parallel to the X direction and through the center of tool L. To be more precise, scanning heads Ex, Ey of second group GE2 are obtained by mirroring scanning heads Ex, Ey of first group GE1 about axis A. The same is true for reflective scales Rx, Ry of the two groups GR1, GR2.

In this exemplary embodiment, table T1 moves on support T2 in scanning direction Y, while support T2 remains at rest during a scanning movement. Consequently, scanning heads Ex, Ey are also at rest during a scanning movement, and thus their cables do not need to be moved either. In addition, the mass moved during a scanning operation is significantly less here than in the first exemplary embodiment.

The switchover from one group GE1 or GE2 to the respective other group, which is necessary during each scanning operation, may, under certain circumstances, be selected to take place in a less critical region; i.e., in a region outside the active chip area of wafer W.

This second exemplary embodiment requires only reflective scales Rx, Ry which each have structures for measurement of only one direction X, Y. Thus, the scales can be made narrower, lighter in weight, and less costly.

Both exemplary embodiments have primarily discussed the arrangement of scanning heads Ex, Ey for measuring the position of table T1 in the X-Y plane. As mentioned at the outset, the position of the table in the Z direction and its tilt about the X direction and the Y direction can be determined by additionally measuring the distance between table T1 and the plane of processing tool L at at least three different points which do not lie on a straight line in the plane of the table. These measurements may, in principle, be performed using any of the available distance sensors. However, it is particularly advantageous if scanning heads Ex, Ey are designed such that they are also capable of measuring the distance between the respective reflective scales Rx, Ry and transmissive scales Tx, Ty being scanned, as described, for example, in the prior art mentioned at the outset. Since in all exemplary embodiments, at least one group of scanning heads GE1, GE2 including three scanning heads Ex, Ey is in positional correspondence, the position of table T1 relative to tool L can be determined in all possible positions of table T1 in all six degrees of freedom. In the first exemplary embodiment, the table can be moved in both the X and Y directions over distances significantly greater than its extent in a respective direction. In the second exemplary embodiment, this is possible at least for scanning direction Y.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B, and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. An X-Y table with a position-measuring device, comprising:
 a table which is disposed on a support that is movable relative to a underlying stationary base in one of two orthogonal directions of a plane of the table, the table being movable on the support in the other of the two directions so that altogether the table is positionable in a plane parallel to the underlying stationary base; and
 two groups of scanning heads disposed on the support, each of the two groups of scanning heads including at least two scanning heads, wherein, for position measurement in each of the two directions, a respective one of the scanning heads is configured to direct light through a respective transmissive scale attached along an edge of the table such that a respective reflective scale, which is stationary relative to a processing tool disposed above the table, reflects the light through the respective transmissive scale back to the respective scanning head,
 wherein, in a central position of the table, the at least two scanning heads of each of the two groups of scanning heads are in positional correspondence with the transmissive scales, and, in either of two edge positions of the table, only the at least two scanning heads of one of the two groups of scanning heads is in positional correspondence with the transmissive scales.

2. The device as recited in claim 1, wherein each respective one of the transmissive scales scanned by the respective one of the scanning heads, and an associated one of the reflective scales are orthogonal to one another and extend parallel to the two directions of movement of the table.

3. The device as recited in claim 1, wherein each of the two groups of scanning heads includes at least three scanning heads.

4. The device as recited in claim 1, wherein the two groups of scanning heads, including the scanning heads therein, are arranged symmetrically with respect to each other relative to an axis of symmetry.

5. The device as recited in claim 4, wherein the axis of symmetry runs through a center of the processing tool.

6. The device as recited in claim 1, wherein the scanning heads are configured to sense a distance between the respective transmissive scale being scanned and an associated one of the reflective scales in a direction normal to the plane of the table.

7. The device as recited in claim 1, wherein the X-Y table is configured to perform line-by-line processing of an object placed on the table, the processing of a line being performed during a scanning movement of the table in a first direction, followed by a line-feed movement in a second direction perpendicular to the first direction.

8. The device as recited in claim 7, wherein the support carrying the table is configured to perform the scanning movement relative to the underlying base, carrying the table along with it, and wherein the table is configured to perform the line-feed movement relative to the support.

9. The device as recited in claim 8, wherein the two groups of scanning heads, including the scanning heads therein, are arranged in such a way that the scanning movement of the table is performable without switching between the two groups.

10. The device as recited in claim 7, wherein the table is configured to perform the scanning movement relative to the support, and wherein the support is configured to perform the line-feed movement relative to the underlying base, carrying the table along with it.

11. The device as recited in claim 10, wherein the two groups of scanning heads, including the scanning heads therein, are arranged in such a way that, during each scanning movement of the table, it is necessary to switch between the groups for the position measurement.

* * * * *